(12) United States Patent
Lee et al.

(10) Patent No.: US 11,101,007 B2
(45) Date of Patent: Aug. 24, 2021

(54) SEMICONDUCTOR DEVICE AND METHOD OF OPERATING SEMICONDUCTOR DEVICE

(71) Applicant: SK hynix Inc., Gyeonggi-do (KR)

(72) Inventors: Hee Youl Lee, Gyeonggi-do (KR); Ji Hyun Seo, Seoul (KR); Se Hoon Kim, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 77 days.

(21) Appl. No.: 16/593,791

(22) Filed: Oct. 4, 2019

(65) Prior Publication Data

US 2020/0258585 A1  Aug. 13, 2020

(30) Foreign Application Priority Data

Feb. 11, 2019 (KR) .................. 10-2019-0015732

(51) Int. Cl.
| | | |
|---|---|---|
| G11C 16/04 | (2006.01) | |
| G11C 16/34 | (2006.01) | |
| G11C 16/24 | (2006.01) | |
| G11C 16/16 | (2006.01) | |
| G11C 16/08 | (2006.01) | |

(52) U.S. Cl.
CPC .......... *G11C 16/3459* (2013.01); *G11C 16/08* (2013.01); *G11C 16/16* (2013.01); *G11C 16/24* (2013.01); *G11C 16/3445* (2013.01)

(58) Field of Classification Search
CPC ..... G11C 16/3459; G11C 16/08; G11C 16/16; G11C 16/24; G11C 16/3445
See application file for complete search history.

(56) References Cited

U.S. PATENT DOCUMENTS

| | | | |
|---|---|---|---|
| 9,373,390 B1* | 6/2016 | Lee .................. | G11C 16/3459 |
| 10,706,941 B1* | 7/2020 | Lu .................... | G11C 11/5628 |
| 2018/0075909 A1* | 3/2018 | Lee .................. | G11C 16/3459 |
| 2020/0321058 A1* | 10/2020 | Lee .................. | G11C 16/10 |

FOREIGN PATENT DOCUMENTS

| | | |
|---|---|---|
| KR | 10-2009-0098799 | 9/2009 |
| KR | 10-2015-0116811 | 10/2015 |
| KR | 10-1785448 | 10/2017 |

* cited by examiner

*Primary Examiner* — Tuan T Nguyen
(74) *Attorney, Agent, or Firm* — IP & T Group LLP (57) ABSTRACT

Provided herein may be a semiconductor device and a method of operating a semiconductor device. The method may include: performing a first program operation on a selected memory cell using a first program pulse, a first bit line voltage, a first pre-verify voltage, and a first main verify voltage, with a first level difference between the first pre-verify voltage and the first main verify voltage; and performing a second program operation on the selected memory cell using a second program pulse, a second bit line voltage, a second pre-verify voltage, and a second main verify voltage, with a second level difference between the second pre-verify voltage and the second main verify voltage. The second level difference may be less than the first level difference, and the second bit line voltage may have a level higher than a level of the first bit line voltage.

9 Claims, 11 Drawing Sheets

SEMICONDUCTOR DEVICE AND METHOD OF OPERATING SEMICONDUCTOR DEVICE

CROSS-REFERENCE TO RELATED APPLICATION

The present application claims priority under 35 U.S.C. § 119(a) to Korean patent application number 10-2019-0015732, filed on Feb. 11, 2019, which is incorporated herein by reference in its entirety.

BACKGROUND

Field of Invention

Various embodiments of the present invention disclosure generally relate to an electronic device and, more particularly, to a semiconductor device and a method of operating the semiconductor device.

Description of Related Art

Semiconductor memory devices are memory devices that includes semiconductors such as silicon (Si), germanium (Ge), gallium arsenide (GaAs), indium phosphide (InP), or the like. Semiconductor memory devices are classified into volatile memory devices and nonvolatile memory devices.

Volatile memory devices are memory devices in which data stored therein is lost when power is interrupted. Representative examples of volatile memory devices include a static RAM (SRAM), a dynamic RAM (DRAM), and a synchronous DRAM (SDRAM). Nonvolatile memory devices are memory devices which retain data stored therein even when power is interrupted. Representative examples of nonvolatile memory devices include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). Flash memories are classified into NOR type and NAND type. Due to ever increasing consumer demand for smaller, more powerful electronic devices, semiconductor memory devices which exhibit improved characteristics are highly desirable.

SUMMARY

Various embodiments of the present invention disclosure are directed to a semiconductor device having improved operating characteristics, and a method of operating the semiconductor device. More specifically, the present invention relates to an improved programming and verification method of operation of a semiconductor device that improves distribution efficiency and reduces programming time. The present invention is particularly suitable for non-volatile memory such as, for example, a NAND flash memory.

According to an embodiment of the present invention, an improved method of operating a semiconductor device is provided which includes: performing a first program operation on a selected memory cell using a first program pulse, a first bit line voltage, a first pre-verify voltage, and a first main verify voltage, with a first level difference between the first pre-verify voltage and the first main verify voltage; and performing a second program operation on the selected memory cell using a second program pulse, a second bit line voltage, a second pre-verify voltage, and a second main verify voltage, with a second level difference between the second pre-verify voltage and the second main verify voltage, wherein the second level difference may be less than the first level difference, and the second bit line voltage may have a level higher than a level of the first bit line voltage.

According to another embodiment of the present invention a method of operating a semiconductor device may include: performing a first program operation of performing a program operation using a first program pulse and a verify operation using a first pre-verify voltage and a first main verify voltage having a first level difference therebetween, and applying, when a selected memory cell has a threshold voltage between the first pre-verify voltage and the first main verify voltage, a first bit line voltage to a selected bit line and applying an increased first program pulse to a selected word line; and performing a second program operation of performing a program operation using a second program pulse and a verify operation using a second pre-verify voltage and a second main verify voltage having a second level difference therebetween, and applying, when the selected memory cell has a threshold voltage between the second pre-verify voltage and the second main verify voltage, a second bit line voltage to the selected bit line and applying an increased second program pulse to the selected word line, wherein, when the second level difference is less than the first level difference, the second bit line voltage may have a level higher than the first bit line voltage.

According to yet another embodiment of the present invention, a method of operating a semiconductor device may include a memory string including a plurality of memory cells and coupled between a source line and a bit line, the method including: applying a first bit line voltage to a selected bit line coupled to a selected memory string, and applying a first program pulse to a selected word line coupled to a selected memory cell; applying a first pre-verify voltage to the selected word line; applying a first main verify voltage to the selected word line when a first pre-verify operation using the first pre-verify voltage passes; applying an increased first bit line voltage to the selected bit line when a first main verify operation using the first main verify voltage fails; and applying an increased first program pulse to the selected word line when the increased first bit line voltage is applied to the selected bit line, wherein, as a first level difference between the first pre-verify voltage and the first main verify voltage is smaller, an increment of the first bit line voltage may be greater.

The present invention also relates to a semiconductor device including: a memory string coupled between a source line and a bit line, and including a plurality of memory cells; a peripheral circuit configured to perform a first program operation on the plurality of memory cells using a first program pulse, a first bit line voltage, a first pre-verify voltage, and a first main verify voltage, with a first level difference between the first pre-verify voltage and the first main verify voltage, and then perform a second program operation on the plurality of memory cells using a second program pulse, a second bit line voltage, a second pre-verify voltage, and a second main verify voltage, with a second level difference between the second pre-verify voltage and the second main verify voltage; and a control logic configured to control the peripheral circuit such that the second level difference is less than the first level difference, and the second bit line voltage has a level higher than a level of the first bit line voltage.

These and other features and advantages of the present invention will become apparent to those skilled in the art of the invention from the following detailed description in conjunction with the following drawings.

DETAILED DESCRIPTION

Hereinafter, embodiments of the present invention disclosure will be described in detail with reference to the attached drawings. In the following description, only parts and steps required for understanding the operations and structure of the present invention will be described in detail, whereas explanation of other parts or steps which are well known will be omitted to avoid obscuring the disclosure of the features of the present invention. It is also noted that the present invention disclosure is not limited to the embodiments set forth herein but may be embodied in other embodiments and/or variations thereof. The described embodiments are provided so that the present invention disclosure will be thorough and complete, and will fully convey the invention to those skilled in the art to which the present invention belongs.

It will be understood that when an element is referred to as being "coupled" or "connected" to another element, it can be directly coupled or connected to the other element or intervening elements may be present therebetween. In the specification, when an element is referred to as "comprising" or "including" a component, it does not preclude another component but may further include other components unless the context clearly indicates otherwise.

The present invention disclosure is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise. The articles 'a' and 'an' as used in this application and the appended claims should generally be construed to mean 'one or more' unless specified otherwise or clear from context to be directed to a singular form.

Unless otherwise defined, all terms including technical and scientific terms used herein have the same meaning as commonly understood by one of ordinary skill in the art to which the present invention belongs in view of the present disclosure.

It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

It should also be noted that features present in one embodiment may be used with one or more features of another embodiment without departing from the scope of the invention. It is noted that reference to "an embodiment," "another embodiment" or the like does not necessarily mean only one embodiment, and different references to any such phrase are not necessarily to the same embodiment(s).

Figure 1:
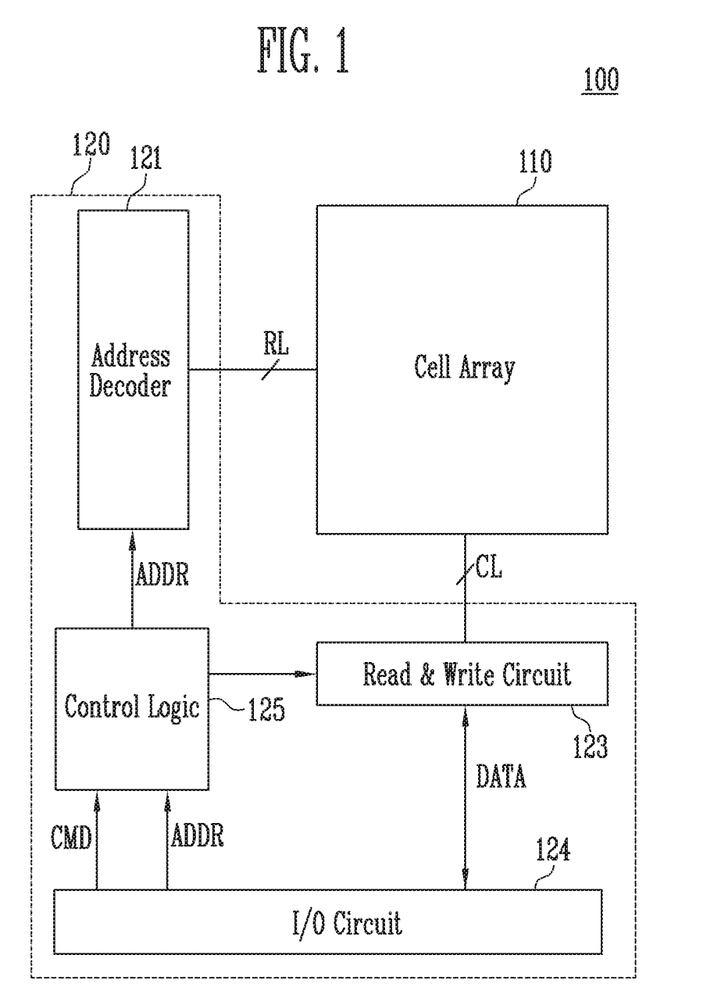
FIG. 1 is a block diagram illustrating a configuration of a semiconductor device in accordance with an embodiment of the present invention disclosure.

FIG. 1 is a block diagram illustrating a configuration of a semiconductor device 100 in accordance with an embodiment of the present invention disclosure. Referring to FIG. 1, the semiconductor device 100 may include a cell array 110 and a peripheral circuit 120. Here, the semiconductor device 100 may be a memory device, e.g., a nonvolatile memory device. For example, the semiconductor device 100 may be a flash memory device such as a NAND or a NOR flash memory device.

The cell array 110 may be coupled to an address decoder 121 through a plurality of row lines RL. The cell array 110 may be coupled to a read/write circuit 123 through a plurality of column lines CL. The row lines RL may include word lines. The column lines CL may include bit lines. However, in an embodiment, the row lines may include bit lines, and the column lines may include word lines.

The cell array 110 may include a plurality of memory strings. The memory strings may be arranged on a substrate in a horizontal or a vertical direction. Furthermore, the cell array 110 may include a plurality of memory blocks and each of the memory blocks may include a plurality of pages. For example, the semiconductor device 100 may perform an erase operation on a memory block basis, and perform a program operation or a read operation on a page basis.

The peripheral circuit 120 may include the address decoder 121, the read/write circuit 123, an input/output circuit 124, and a control logic 125.

The control logic 125 may be coupled to the address decoder 121, the read/write circuit 123, and the input/output circuit 124. The control logic 125 may receive a command CMD and an address ADDR from the input/output circuit 124, and control the address decoder 121 and the read/write circuit 123 to perform an internal operation according to the received command CMD and address ADDR.

The address decoder 121 may be coupled to the cell array 110 through the row lines RL. For example, the address decoder 121 may be coupled to the cell array 110 through word lines, dummy word lines, source select lines, and drain select lines. Furthermore, the address decoder 121 may control the row lines RL under control of the control logic 125. Therefore, the address decoder 121 may receive an address ADDR from the control logic, and select any one of the memory blocks of the cell array 110 in response to the received address ADDR.

A program operation and a read operation of the semiconductor device 100 may be performed on a page basis. Hence, during the program operation or the read operation, the address ADDR may include a block address and a row address. The address decoder 121 may decode the block address of the received address ADDR, and select a corresponding memory block according to the decoded block address. The address decoder 121 may decode the row address of the received address ADDR, and select a corresponding page of the selected memory block according to the decoded row address.

An erase operation of the semiconductor device 100 may be performed on a memory block basis. Therefore, during the erase operation, the address ADDR may include a block address. The address decoder 121 may decode the block address and select a corresponding memory block according to the decoded block address.

The read/write circuit 123 is coupled to the cell array 110 through the column lines CL. The column lines CL may be bit lines. During a program operation, the read/write circuit 123 may transmit, to the column lines CL, data DATA received from the input/output circuit 124, and memory cells of a selected page may be programmed according to the transmitted data DATA. The data DATA may be multi-bit data to be programmed to respective memory cells. During a read operation, the read/write circuit 123 may read data DATA from the memory cells in the selected page through the column lines CL, and output the read data DATA to the input/output circuit 124. During an erase operation, the read/write circuit 123 may float the column lines CL. For reference, the program operation or the erase operation may include a verify operation. The verify operation may be performed in a manner similar to that of read operation.

During a program operation, the address decoder 121 may apply a program voltage to a selected word line and apply a pass voltage having a level lower than that of the program voltage to unselected word lines. Here, a program enable voltage (e.g., a ground voltage) may be applied to a selected bit line coupled to a selected memory string, and a program inhibit voltage (e.g., a power supply voltage) may be applied to unselected bit lines.

During a program verify operation, the address decoder 121 may apply a verify voltage to a selected word line and apply a verify pass voltage having a level higher than that of the verify voltage to unselected word lines. The program verify operation may be performed using a plurality of verify voltages. For example, the program verify operation may be performed using a pre-verify voltage and a main verify voltage which have a difference in level therebetween. The main verify voltage may have a level higher than that of the pre-verify voltage.

According to an embodiment, the control logic 125 may control the address decoder 121 and the read/write circuit 123 so that a program operation may be performed in a multi-operation manner. For example, a second program operation may be performed after a first program operation has been performed. If memory cells programmed during the first program operation have a threshold voltage distribution with a first width, the first width may be reduced to a second width during the second program operation. As such, the threshold voltage distribution width of the programmed memory cells may be reduced by performing the program operation in the multi-operation manner.

The control logic 125 may control the address decoder 121 and the read/write circuit 123 such that conditions of the first program operation differ from that of the second program operation.

In an embodiment, the first program operation may be performed using a first program pulse, a first pre-verify voltage, a first main verify voltage, and a first bit line voltage. If a first pre-verify operation has passed, a first main verify operation may be performed. If the first main verify operation has failed, a first bit line voltage may be changed depending on a first level difference between the first pre-verify voltage and the first main verify voltage. For example, as the first level difference is smaller, an increment of the first bit line voltage may be greater.

In an embodiment, the second program operation may be performed after the first program operation has been completed. The second program operation may be performed using a second program pulse, a second pre-verify voltage, a second main verify voltage, and a second bit line voltage. If a second pre-verify operation has passed, a second main verify operation may be performed. If the second main verify operation has failed, a second bit line voltage may be changed depending on a second level difference between the second pre-verify voltage and the second main verify voltage. For example, as the second level difference is small, an increment of the second bit line voltage may be great.

In an embodiment, after the first program operation has been performed using the first pre-verify voltage and the first main verify voltage that have the first level difference, the second program operation may be performed using the second pre-verify voltage and the second main verify voltage that have the second level difference. The bit line voltage to be used during the second program operation may be determined by comparing the first level difference and the second level difference. For example, if the second level difference is less than the first level difference, the bit line voltage to be used during the second program operation may be higher than the bit line voltage to be used during the first program operation.

Figure 2:
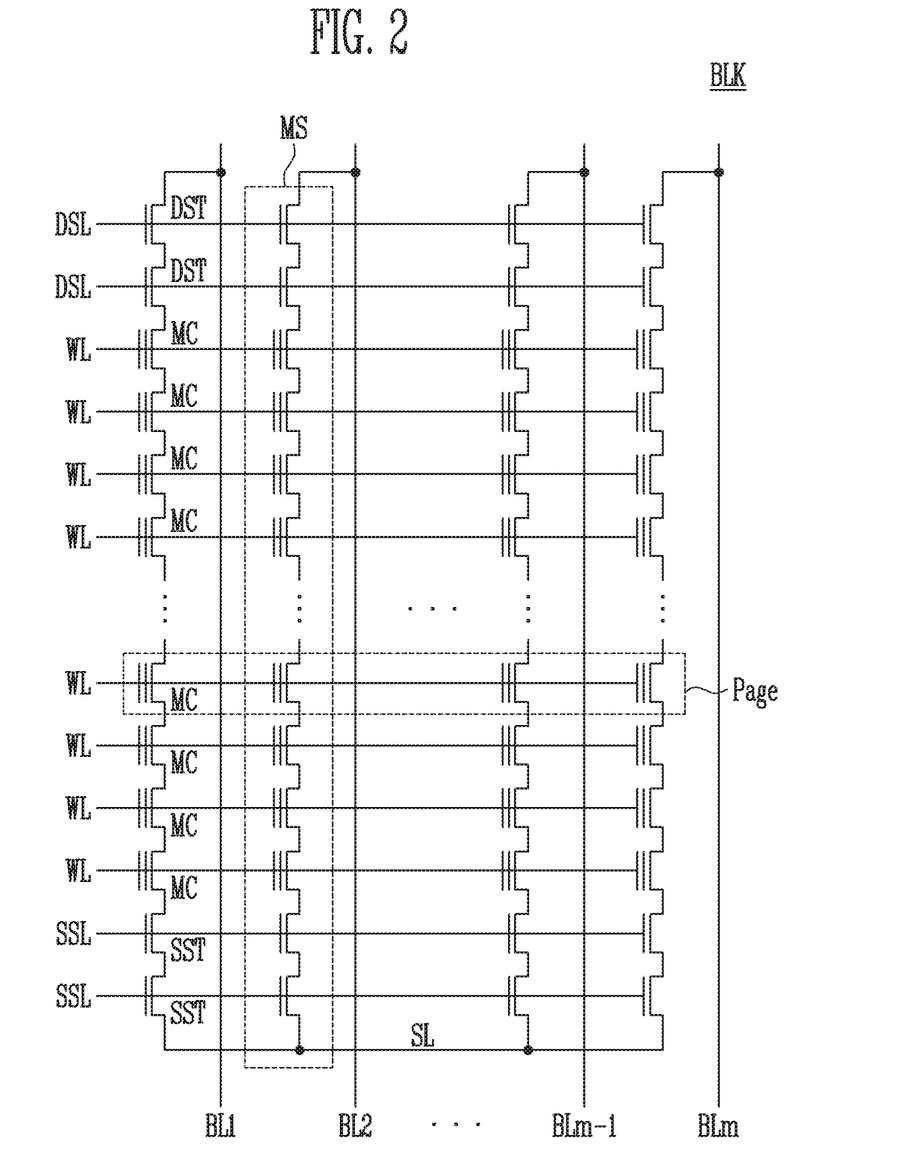
FIGS. 2 to 4 are circuit diagrams illustrating a cell array structure of the semiconductor device in accordance with embodiments of the present invention disclosure.
Figure 3:
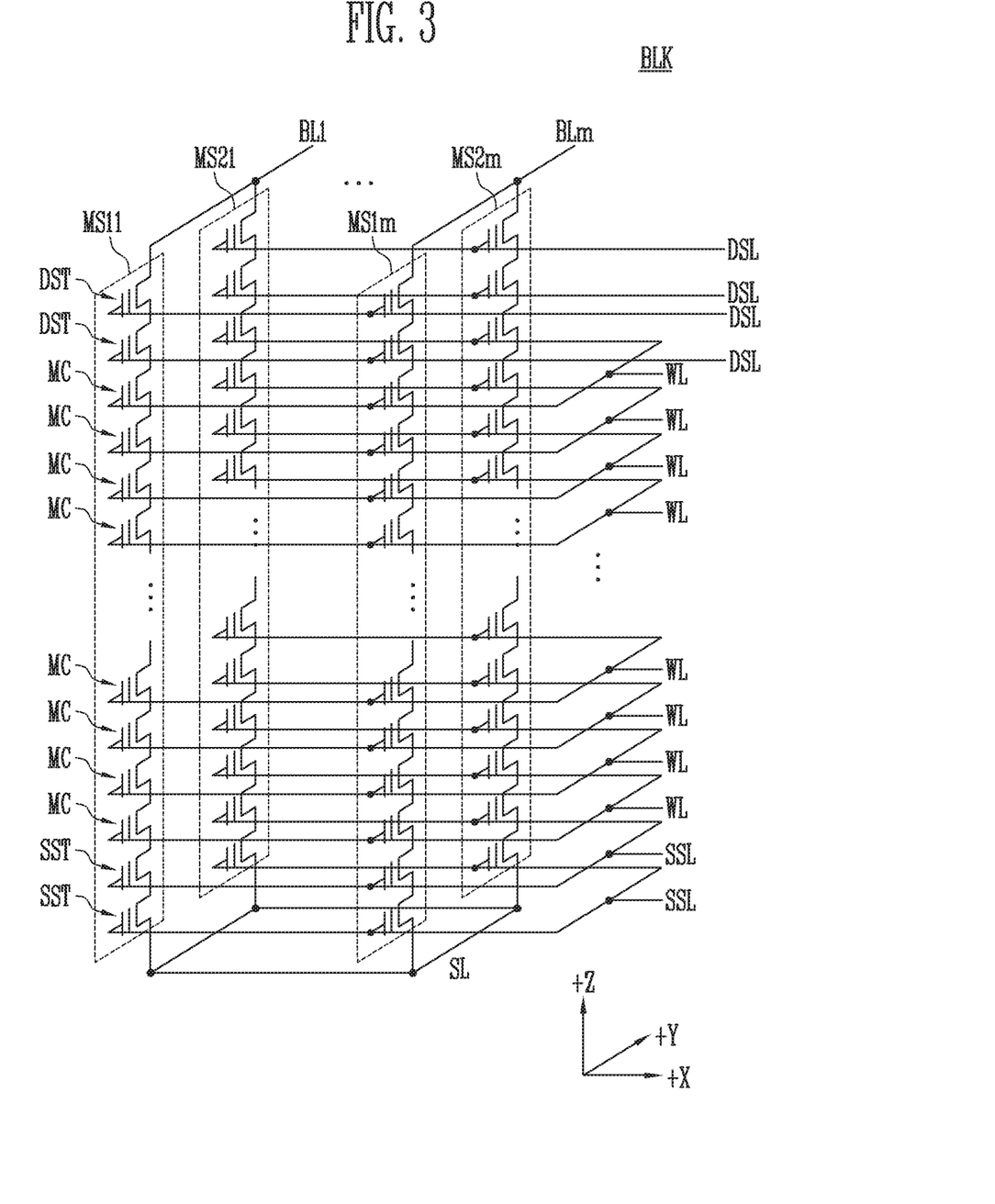
Figure 4:
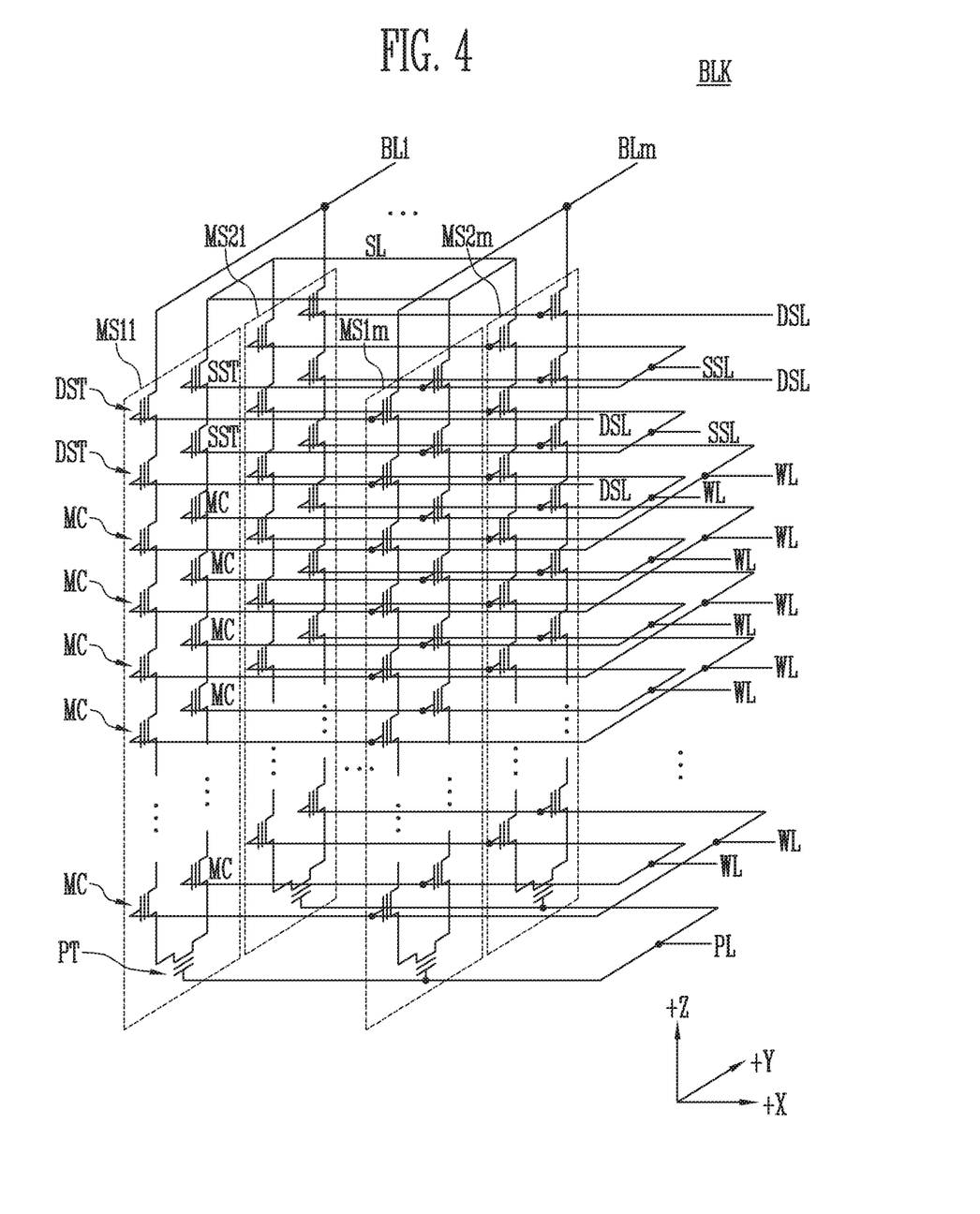

FIGS. 2 to 4 are circuit diagrams illustrating a cell array structure of the semiconductor device in accordance with embodiments of the present invention disclosure.

Referring to FIG. 2, the cell array may include a plurality of memory blocks BLK, and each of the memory blocks BLK may include a plurality of memory strings MS. The plurality of memory strings MS are coupled between bit lines BL1 to BLm and a source line SL.

Each of the memory strings MS includes at least one drain select transistor DST, a plurality of memory cells MC, and at least one source select transistor SST which are coupled in series to each other. Here, m is an integer of 2 or more.

For reference, although not illustrated, each of the memory strings MS may further include a dummy memory cell disposed between the source select transistor SST and the memory cells MC, between the drain select transistor DST and the memory cells MC, between the source select transistor SST and the source line SL, or between the drain select transistor DST and the bit line BL. Furthermore, the memory cells MC that are included in one memory string MS may be disposed at substantially the same level or at different levels.

Gate electrodes of the memory cells MC are coupled to the word lines WL. Word line voltages (e.g., a program bias, a pre-program bias, and a read bias) required for driving may be applied to each of the word lines WL. Gate electrodes of the drain select transistors DST are coupled to the drain select line DSL. Gate electrodes of the source select transistors SST are coupled to the source select line SSL.

According to the above-mentioned configuration, memory cells MC that are coupled to the same word line WL and configured to be programmed at the same time may form one page. Each memory block BLK may include a plurality of pages.

Referring to FIG. 3, the memory block BLK includes a plurality of memory strings MS11 to MS1$m$ and MS21 to MS2$m$ which are coupled between the bit lines BL1 to BLm and the source line SL. Each of the memory strings MS11 to MS1$m$ and MS21 to MS2$m$ may extend in a +Z direction. Here, the +Z direction may be a direction in which the memory cells MC are stacked. Here, m is an integer of 2 or more.

Each of the memory strings MS11 to MS1$m$ and MS21 to MS2$m$ includes at least one source select transistor SST, a plurality of memory cells MC, and at least one drain select transistor DST which are successively stacked.

The source select transistors SST included in each of the memory strings MS11 to MS1$m$ and MS21 to MS2$m$ may be coupled in series between the memory cells MC and the source line SL. Furthermore, source select transistors SST having the same level may be coupled to the same source select line SSL.

The memory cells MC included in each of the memory strings MS11 to MS1$m$ and MS21 to MS2$m$ may be coupled in series between the source select transistors SST and the drain select transistors DST. Furthermore, memory cells MC having the same level may be coupled to the same word line WL.

The drain select transistors DST included in each of the memory strings MS11 to MS1$m$ and MS21 to MS2$m$ may be coupled in series between the corresponding bit line BL1 to BLm and the memory cells MC. Here, among drain select transistors DST of the memory strings MS11 to MS1$m$ and MS21 to MS2$m$ that are arranged in the same row (in a +X direction), drain select transistors DST having the same level may be coupled to the same drain select line DSL. Furthermore, drain select transistors DST arranged on different rows (in the +X direction) may be coupled to different drain select lines DSL.

Referring to FIG. 4, the memory block BLK may include a plurality of memory strings MS11 to MS1$m$ and MS21 to MS2$m$. Each of the memory strings MS11 to MS1$m$ and MS21 to MS2$m$ may include at least one source select transistor SST, a plurality of memory cells MC, at least one pipe transistor PT, a plurality of memory cells MC, and at least one drain select transistor DST which are coupled in series to each other. Here, each of the memory strings MS11 to MS1$m$ and MS21 to MS2$m$ may have a 'U'-shaped structure.

The pipe transistor PT couples drain-side memory cells MC and source-side memory cells MC. Furthermore, a gate of the pipe transistor PT of each of the memory strings MS11 to MS1$m$ and MS21 to MS2$m$ may be coupled to a pipe line (PL). The other configurations are similar to those described with reference to FIG. 3; therefore, repetitive explanations will be omitted.

Figure 5A:
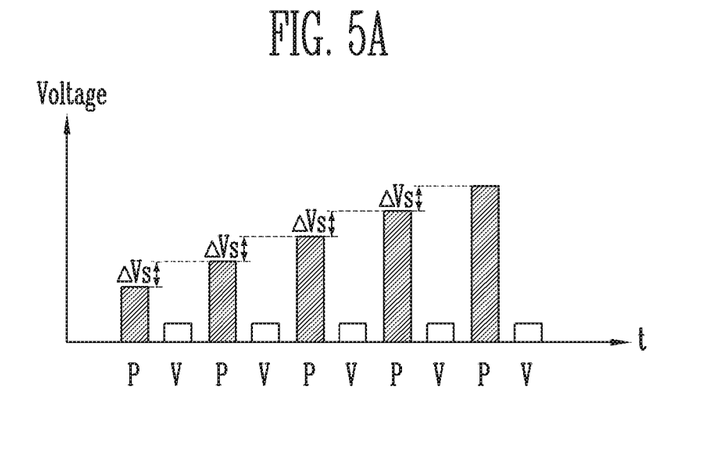
FIGS. 5A to 5C are diagrams for describing a method of operating the semiconductor device in accordance with an embodiment of the present invention disclosure.
Figure 5B:
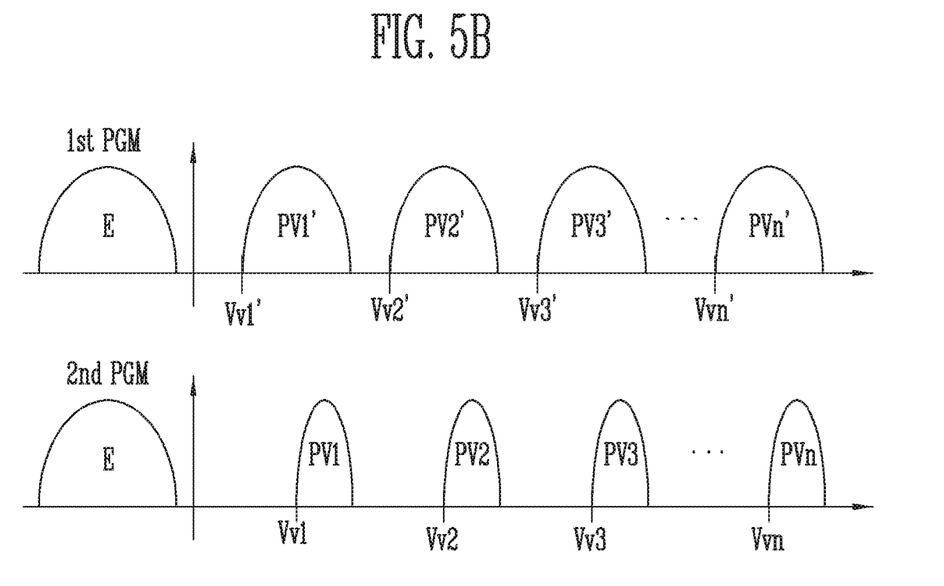
Figure 5C:
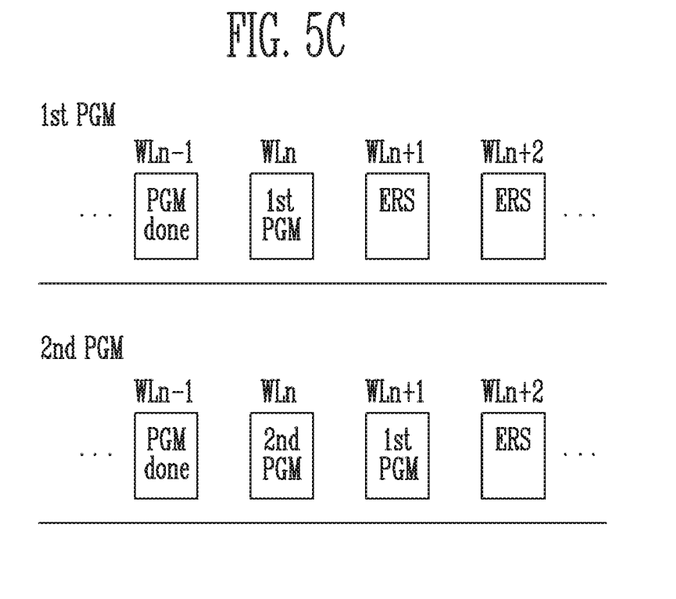

FIGS. 5A to 5C are diagrams for describing a method of operating the semiconductor device in accordance with an embodiment of the present invention disclosure.

A multi-level cell MLC may store 2 or more-bit data therein. A programmed memory cell may have a status corresponding to one of a plurality of threshold voltage distributions PV1 to PVn. When 2-bit data is stored in one memory cell, the memory cell may have one status of an erased status and first to third programmed statuses. When 3-bit data is stored in one memory cell, the memory cell may have one status of an erased status and first to seventh programmed statuses.

Referring to FIG. 5A, during a program operation, a selected memory cell may be programmed to have one of a plurality of programmed statuses according to data to be programmed. The program operation may be performed by executing a plurality of program loops until the threshold voltage of the selected memory cell reaches a target programmed status.

According to an incremental step pulse programming (ISPP) method, the program operation may be performed using a program pulse P which increases a program voltage by a step voltage $\Delta Vs$. Each program loop may include a verify pulse V between program pulses P. The verify pulse V may be applied to a selected word line to verify whether the program operation has passed.

Referring to FIG. 5B, each of the memory cells may have any one status of an erased status E and first to N-th programmed statuses PV1' to PVn' by a first program operation 1st PGM. The first program operation 1st PGM may use first verify voltages Vv1' to Vvn'. Furthermore, the first program operation 1st PGM may be performed by the ISPP method in which the program voltage increases by a first step voltage. Memory cells on which the first program operation 1st PGM has been performed may have a threshold voltage distribution with a relatively large width.

Subsequently, when a second program operation 2nd PGM is performed, each of the memory cells may have any one status of the erased status E and first to N-th programmed statuses PV1 to PVn. The second program operation 2nd PGM may use second verify voltages Vv1 to Vvn. The second verify voltages Vv1 to Vvn of the program statuses PV1 to PVn may respectively have levels higher than those of the first verify voltages Vv1' to Vvn'. Furthermore, the second program operation 2nd PGM may be performed by the ISPP method in which the program voltage increases by a second step voltage. The second step voltage may have a value less than that of the first step voltage. Memory cells on which the second program operation 2nd PGM has been performed may have a threshold voltage distribution with a relatively smaller width than the threshold voltage distribution of memory cells on which the first program operation was performed.

Referring to FIG. 5C, after the first program operation 1st PGM is performed on a selected word line WLn, the second program operation 2nd PGM is performed on the selected word line WLn. When the second program operation 2nd PGM is performed on the selected word line WLn, a first program operation 1st PGM may be performed on a neighboring word line WLn+1. For reference, if the neighboring word line WLn-1 is not in a program completed status, it is also possible to perform a second program operation 2nd PGM on the neighboring word line WLn-1 while the first program operation 1st PGM is performed on the selected word line WLn.

According to the above-described method, since the program operation is performed in a multi-operation manner, an increase in width of the threshold voltage distribution due to coupling between adjacent word lines may be minimized. Therefore, the distribution width of each of the program statuses PV1 to PVn may be reduced. In addition, since the first step voltage has a value greater than that of the second step voltage, the number of times the first program pulse has been applied may be less than the number of times the second program pulse has been applied. Hence, the program time may be reduced as compared to performing first and second programming operations using the same first and second step voltages.

Figure 6:
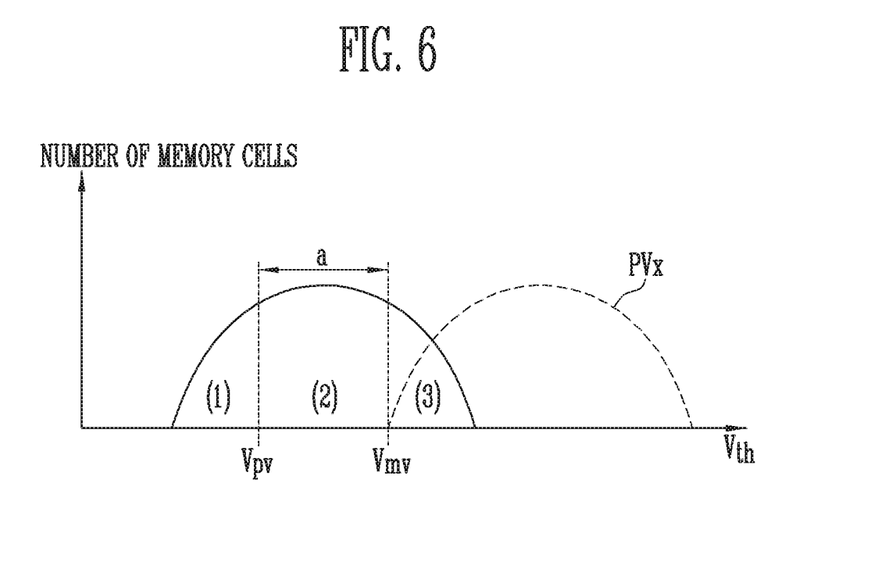
FIG. 6 is a diagram for describing a method of operating the semiconductor device in accordance with an embodiment of the present invention disclosure.

FIG. 6 is a diagram for describing a method of operating the semiconductor device in accordance with an embodiment of the present invention disclosure. The X-axis of the graph indicates the threshold voltage Vth, and the Y-axis indicates the number of memory cells.

During a program verify operation, a plurality of verify voltages may be used in each program loop. For example, a double verify operation using a pre-verify voltage and a main verify voltage may be performed. The pre-verify voltage and the main verify voltage may have a level difference. The pre-verify voltage may have a level lower than that of the main verify voltage.

Referring to FIG. 6, to program a selected memory cell to an arbitrary x-th programmed status PVx of the first to n-th programmed statuses PV1 to PVn, a pre-verify voltage Vpv and a main verify voltage Vmv may be used. First, a program pulse is applied to the selected word line, and the threshold voltage of the selected memory cell is sensed using the pre-verify voltage Vpv. If the pre-verify operation is a pass, the threshold voltage of the selected memory cell is sensed using the main verify voltage Vmv. Depending on a result of the sensing, it may be determined that the memory cell belongs to any one area of an area (1) having a threshold voltage lower than the pre-verify voltage Vpv, an area (2) having a threshold voltage higher than the pre-verify voltage Vpv and lower than the main verify voltage Vmv, and an area (3) having a threshold voltage higher than the main verify voltage Vmv.

Thereafter, a subsequent program loop is performed. Here, depending on the threshold voltage of the memory cell based on the previous loop determination, the level of a bit line voltage to be applied to the corresponding bit line may vary. If the memory cells belong to the area (1), a program enable voltage may be applied to a bit line coupled to the corresponding memory string. The program enable voltage may be a voltage of 0 V. If the memory cells belong to the area (3), a program inhibit voltage may be applied to the bit line coupled to the corresponding memory string. The program inhibit voltage may be an operating voltage Vcc. A program control voltage may be applied to the bit lines coupled to the memory cells of the area (2). The program control voltage may be provided to reduce a program speed of a memory cell. The program control voltage may have a level higher than that of the program enable voltage and less than that of the program inhibit voltage. Therefore, the program control voltage may reduce an increment of the threshold voltage of the memory cell.

According to the above-described method, since the verify operation is performed using a plurality of verify voltages, the width of the threshold voltage distribution may be further reduced. Furthermore, to more finely control the program speed of the memory cell, a level difference between the verify voltages or the bit line voltage (e.g., the program enable voltage, the program control voltage, or the program inhibit voltage) may be adjusted.

The width of the threshold voltage distribution may be further reduced by reducing the level difference between the verify voltages. For example, as a level difference a between the pre-verify voltage Vpv and the main verify voltage Vmv is smaller, the program speed of the memory cell may be more finely adjusted.

Furthermore, the width of the threshold voltage distribution may be further reduced by increasing the level of the bit line voltage (e.g., the program enable voltage, the program control voltage, or the program inhibit voltage). For example, as the level difference a is smaller, the bit line voltage may be greater. In addition, as the step voltage of the program pulse is smaller and the level difference a between the verify voltages is smaller, the bit line voltage may be greater.

According to the above-described method, the program speed of the memory cell may be more finely adjusted by controlling the level difference a between the verify voltages and the bit line voltage. Therefore, the width of the threshold voltage distribution may be controlled to be narrower.

Figure 7A:
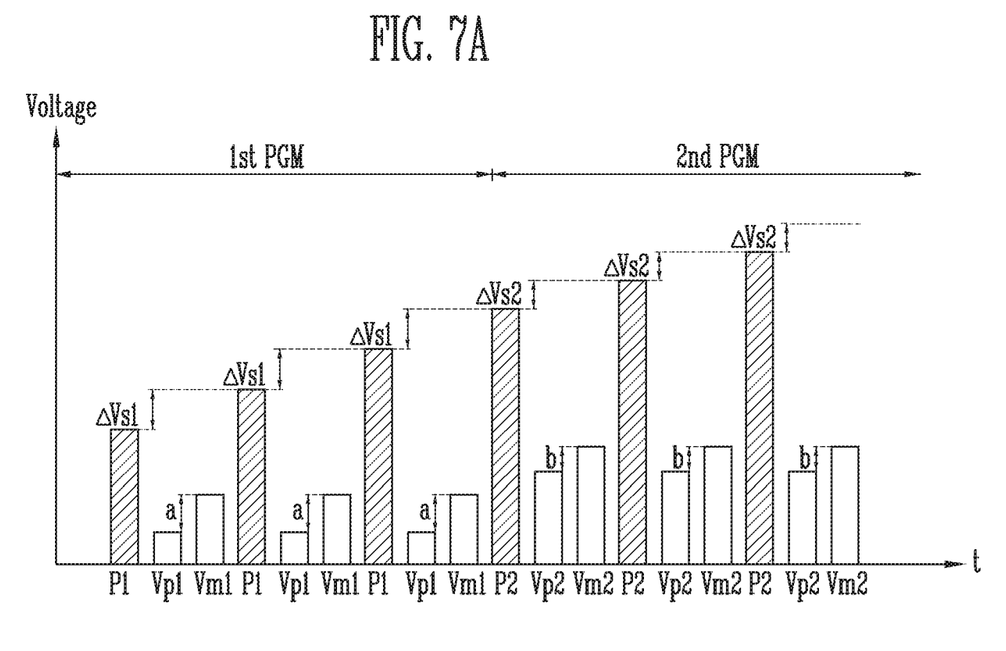
FIGS. 7A to 7B are diagrams for describing a method of operating the semiconductor device in accordance with an embodiment of the present invention disclosure.
Figure 7B:
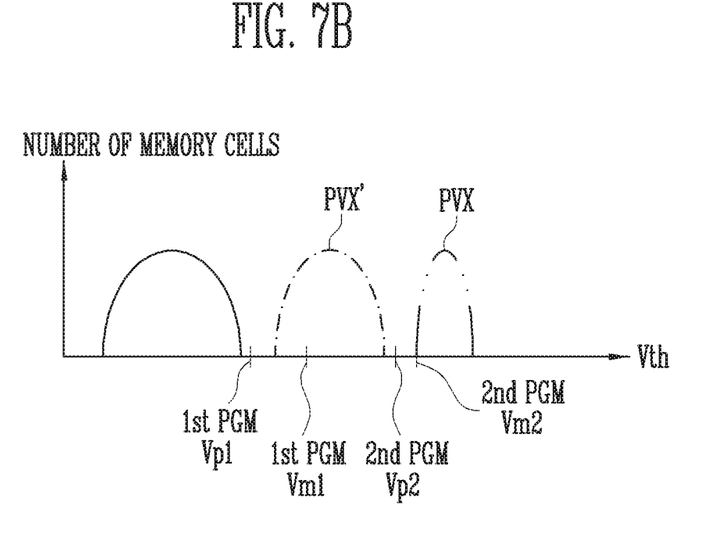

FIGS. 7A to 7B are diagrams for describing a method of operating the semiconductor device in accordance with an embodiment of the present invention disclosure. In FIG. 7A, the X-axis of the graph indicates time, and the Y-axis indicates the voltage. In FIG. 7B, the X-axis of the graph indicates the threshold voltage Vth, and the Y-axis indicates the number of memory cells.

Referring to FIGS. 7A and 7B, if a target program status is PVx, memory cells may be programmed to a program status of PVx' by a first program operation 1st PGM, and thereafter programmed to a program status of PVx by a second program operation 2nd PGM.

The first program operation 1st PGM may be performed using a first pre-verify voltage Vp1, a first main verify voltage Vm1, and a first bit line voltage $V_{BL}1$. The first pre-verify voltage Vp1 and the first main verify voltage Vm1 may have a first level difference a (i.e., a=|Vm1−Vp1|). Furthermore, the first program operation 1st PGM may be performed using a first program pulse P1 having a first step voltage ΔVs1. For example, after the first bit line voltage $V_{BL}1$ has been applied to a selected bit line, the first program pulse P1 may be applied to a selected word line. Here, the first bit line voltage $V_{BL}1$ may be a program enable voltage, a program control voltage, or a program inhibit voltage.

The second program operation 2nd PGM may be performed using a second pre-verify voltage Vp2, a second main verify voltage Vm2, to and a second bit line voltage $V_{BL}2$. The second pre-verify voltage Vp2 and the second main verify voltage Vm2 may have a second level difference b (i.e., b=|Vm2−Vp2|). Furthermore, the second program operation 2nd PGM may be performed using a second program pulse P2 having a second step voltage ΔVs2. For example, after the second bit line voltage $V_{BL}2$ has been applied to a selected bit line, the second program pulse P2 may be applied to a selected word line. Here, the second bit line voltage $V_{BL}2$ may be a program enable voltage, a program control voltage, or a program inhibit voltage.

Each of the first and second bit lines voltages $V_{BL}1$ and $V_{BL}2$ may be set to reflect a level difference a or b between the pre-verify voltage and the main verify voltage. As the level difference a between the first pre-verify voltage Vp1 and the first main verify voltage Vm1 is smaller, the first bit line voltage $V_{BL}1$ may be greater. The second bit line voltage $V_{BL}2$ may be selected taking into account the level difference b between the second pre-verify voltage Vp2 and the second main verify voltage Vm2. More specifically, as the level difference b between the second pre-verify voltage Vp2 and the second main verify voltage Vm2 is getting smaller, the second bit line voltage VBL2 can be selected to be greater.

The level of the second bit line voltage VBL2 may be determined by comparing the first level difference a and the second level difference b. For example, if the second level difference b is less than the first level difference b, the second bit line voltage $V_{BL}2$ may have a level higher than that of the first bit line voltage $V_{BL}1$.

Figure 8:
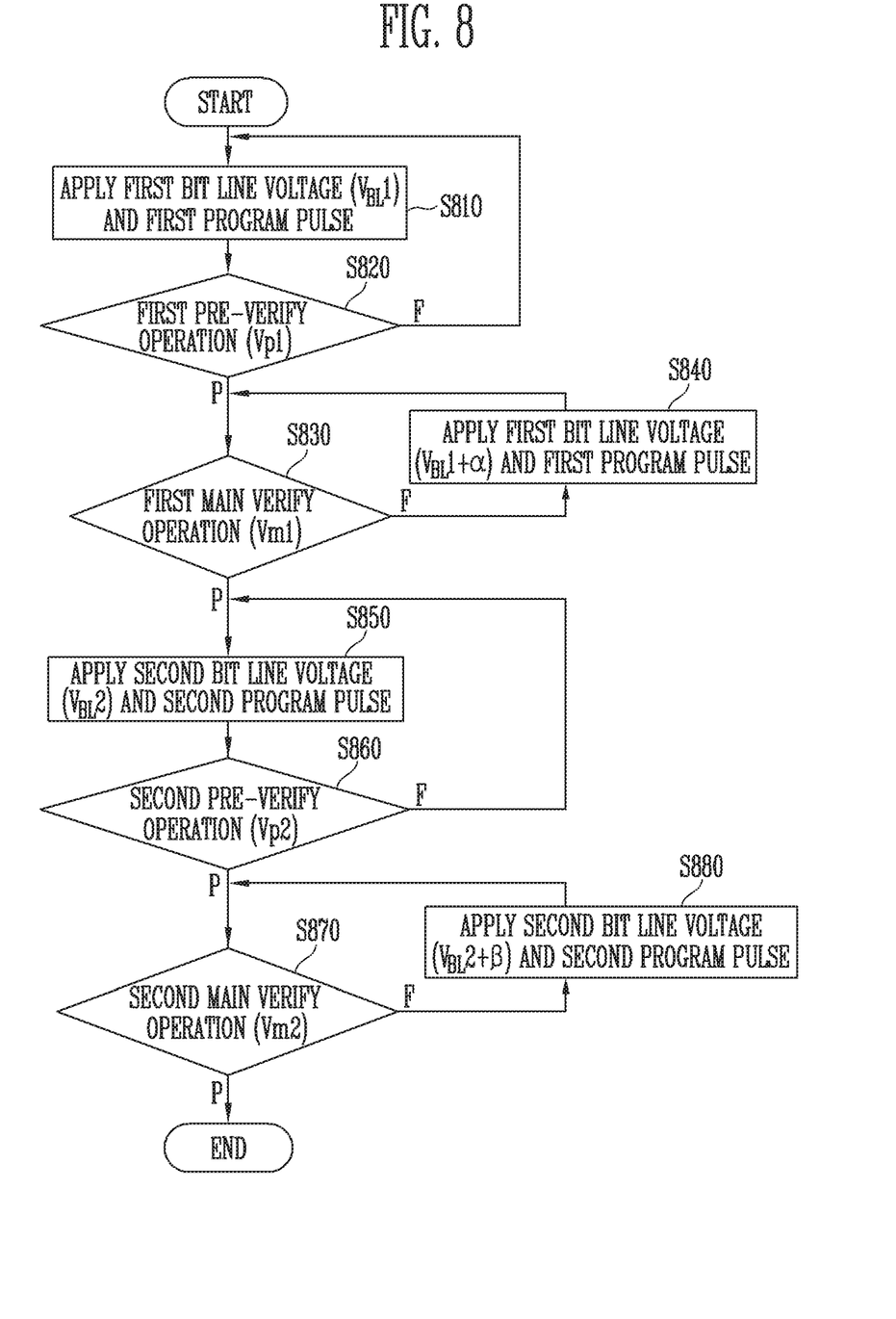
FIG. 8 is a flowchart of a method of operating the semiconductor device in accordance with an embodiment of the present invention disclosure.

FIG. 8 is a flowchart describing a method of operating the semiconductor device in accordance with an embodiment of the present invention disclosure.

Referring to FIG. 8, the semiconductor device may perform a first program operation (S810 to S840) on a selected memory cell, and thereafter perform a second program operation (S850 to S880) on the selected memory cell. Hereinafter, each step of the first program operation (S810 to S840) and the second program operation (S850 to S880) will be described in detail.

First, the first program operation (S810 to S840) may be performed. A first bit line voltage $V_{BL}1$ is applied to a selected bit line, and a first program pulse is applied to a selected word line (at step S810). Here, the first bit line voltage $V_{BL}1$ may be a program enable voltage. Here, a program pass voltage may be applied to unselected word lines, and a program inhibit voltage may be applied to unselected bit lines.

Thereafter, a first pre-verify voltage Vp1 is applied to the selected word line (at step S820). If the first pre-verify operation has failed (that is, "F" at step S820), the first program pulse increased by a first step voltage is applied to the selected word line (at step S810). Here, the first bit line voltage $V_{BL}1$ may be applied to the selected bit line.

If the first pre-verify operation has passed (that is, "P" at step S820), the first main verify voltage Vm1 is applied to the selected word line (at step S830). Here, the first main verify voltage Vm1 may have a first level difference a (i.e., a=|Vm1−Vp1|) between it and the first pre-verify voltage Vp1.

If the first main verify operation has failed (that is, "F" at step S830), an increased first bit line voltage $V_{BL}1+\alpha$ is applied to the selected bit line, and a first program pulse increased by a first step voltage is applied to the selected word line (at step S840). Here, the increased first bit line voltage $V_{BL}1+\alpha$ may be a program control voltage. An increment α of the first bit line voltage $V_{BL}1$ may be determined depending on a first level difference a. Generally, the smaller the first level difference a is, the greater the increment α may be. Furthermore, the first bit line voltage $V_{BL}1+\alpha$ has a level lower than a bit line inhibit voltage. If the first main verify operation has passed, the first program operation is completed.

Subsequently, after the first main verify operation has passed (that is, "P" at step S830) the second program operation (S850 to S880) is performed. First, a second bit line voltage $V_{BL}2$ is applied to the selected bit line, and a second program pulse is applied to the selected word line (at step S850). Here, the second bit line voltage $V_{BL}2$ may be a program enable voltage. Here, a program pass voltage may be applied to unselected word lines, and a program inhibit voltage may be applied to unselected bit lines.

Thereafter, a second pre-verify voltage Vp2 is applied to the selected word line (at step S860). If a second pre-verify operation has failed (that is "F" at step S860), the second program pulse increased by a first step voltage is applied to the selected word line (at step S850). The second step voltage may have a level lower than that of the first step voltage.

If the second pre-verify operation has passed (that is, "P" at step S860), the second main verify voltage Vm2 is applied to the selected word line (at step S870). Here, the second main verify voltage Vm2 may have a second level difference b (b=|Vm2−Vp2|) between it and the second pre-verify voltage Vp2.

If the second main verify operation has failed (that is, "F" at step S880), an increased second bit line voltage $V_{BL}2+\beta$ is applied to the selected bit line, and a second program pulse increased by a second step voltage is applied to the selected word line (at step S880). Here, the increased second bit line voltage $V_{BL}2+\beta$ may be a program control voltage. An increment β of the second bit line voltage $V_{BL}2$ may be determined depending on a second level difference b. As the second level difference b is smaller, the increment β may be greater. Furthermore, if the second level difference b is less than the first level difference a, the increment β may have a value greater than that of the increment α. If the second main verify operation has passed, the second program operation is completed.

According to the above-described method, the second program operation is performed after the first program operation has been performed. The first step voltage may have a value greater than that of the second step voltage. Depending on the first level difference a, the increment α of the first bit line voltage $V_{BL}1$ may be adjusted. Depending on the second level difference b, the increment β of the second bit line voltage $V_{BL}2$ may be adjusted. Furthermore, the increment β may be determined by comparing the first level difference a and the second level difference b.

Figure 9:
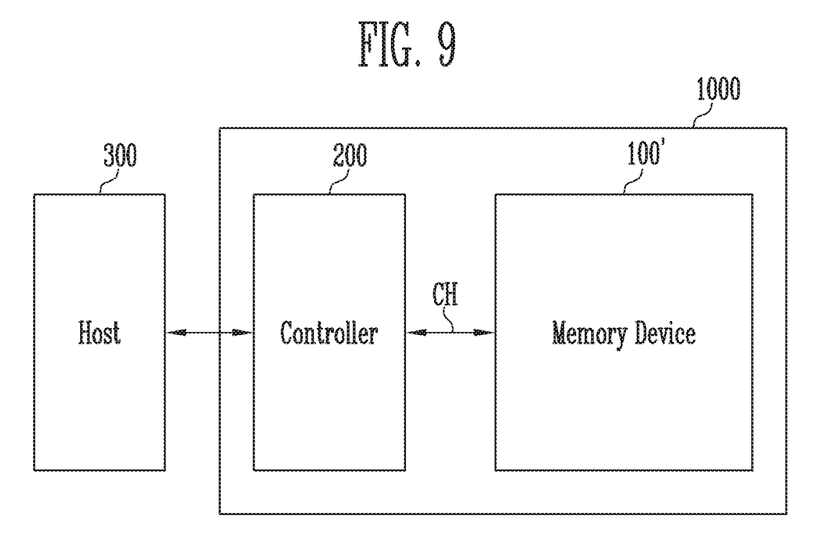
FIG. 9 is a block diagram illustrating a configuration of a memory system in accordance with an embodiment of the present invention disclosure.

FIG. 9 is a block diagram illustrating a configuration of a memory system 1000 in accordance with an embodiment of the present invention disclosure. Referring to FIG. 9, the memory system 1000 includes a memory device 100' and a controller 200.

The controller 200 may control the memory device 100' through a channel CH. The memory device 100' may operate under control of the controller 200. The memory device 100' may include a memory cell array having a plurality of memory blocks. In an embodiment, the memory device 100' may be the semiconductor device 100 described above. In an embodiment, the memory device 100' may be the semiconductor device 100 described above which may also be a flash memory device.

The controller 200 may control the memory device 100' in response to a request of the host 300. Furthermore, the memory device 100' may receive a command and an address from the controller 200 through the channel CH, and access an area selected by the address from the memory cell array. In other words, the memory device 100' may perform an internal operation corresponding to the command on the area selected by the address.

The controller 200 may control the memory device 100' to perform a program operation, a read operation, an erase operation, and so forth. During the program operation, the controller 200 may provide a program command, an address, data, etc. to the memory device 100' through the channel CH. The memory device 100' may program the data to an area selected by the address. During the erase operation, the controller 200 may provide an erase command, an address, etc. to the memory device 100' through the channel CH. The memory device 100' may erase data stored in an area selected by the address. During the erase operation, the controller 200 may provide a read command, an address, etc. to the memory device 100' through the channel CH. The memory device 100' may read data stored in an area selected by the address. Here, the read operation may include not only a read operation of reading data stored in a memory cell to output the data, but also a read operation for performing a verify operation accompanying a program operation or an erase operation.

In a program operation requested from the host 300, the controller 200 may command the memory device 100' to perform a program operation according to the method described with reference to FIGS. 5A to 8. In an embodiment, the program operation may be performed in a multi-operation manner as described earlier. According to the foregoing method, the program speed of the memory cells may be finely adjusted and improved. Also, the width of the threshold voltage distribution may be reduced.

Figure 10:
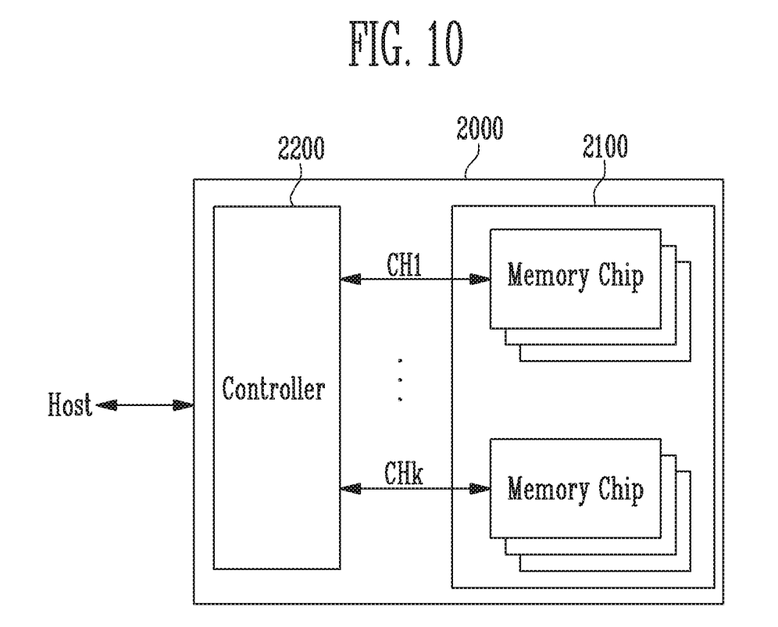
FIG. 10 is a block diagram illustrating a configuration of a memory system in accordance with an embodiment of the present invention disclosure.

FIG. 10 is a block diagram illustrating a configuration of a memory system 2000 in accordance with an embodiment of the present invention disclosure. Referring FIG. 10, the memory system 2000 may include a memory device 2100 and a controller 2200.

The memory device 2100 may be a semiconductor device, and include a plurality of memory chips. The memory chips may be divided into a plurality of groups. The plurality of groups may communicate with the controller 2200 through first to k-th channels CH1 to CHk, respectively. Each memory chip may be configured and operated in a manner similar to that of the memory device 100 described with reference to FIG. 1.

Each group may communicate with the controller 2200 through one common channel. The controller 2200 may have the same configuration as that of the controller 200 described with reference to FIG. 9 and control a plurality of memory chips of the memory device 2100 through the plurality of channels CH1 to CHk. For reference, the memory system 2000 may be modified such that each memory chip is coupled to a corresponding single channel.

The controller 2200 and the memory device 2100 may be integrated into a single semiconductor device. In an embodiment, the controller 2200 and the memory device 2100 may be integrated into a single semiconductor device to form a memory card. For example, the controller 2200 and the memory device 2100 may be integrated into a single semiconductor device and form a memory card such as a personal computer memory card international association (PCM-CIA), a compact flash card (CF), a smart media card (SM or SMC), a memory stick multimedia card (MMC, RS-MMC, or MMC micro), a SD card (SD, miniSD, microSD, or SDHC), or a universal flash storage (UFS).

The controller 2200 and the memory device 2100 may be integrated into a single semiconductor device to form a solid state drive (SSD). The SSD may include a storage device configured to store data in a memory. When the memory system 2000 is used as the SSD, the operating speed of the host Host coupled to the memory system 2000 may be phenomenally improved.

In an embodiment, the memory system 2000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

Figure 11:
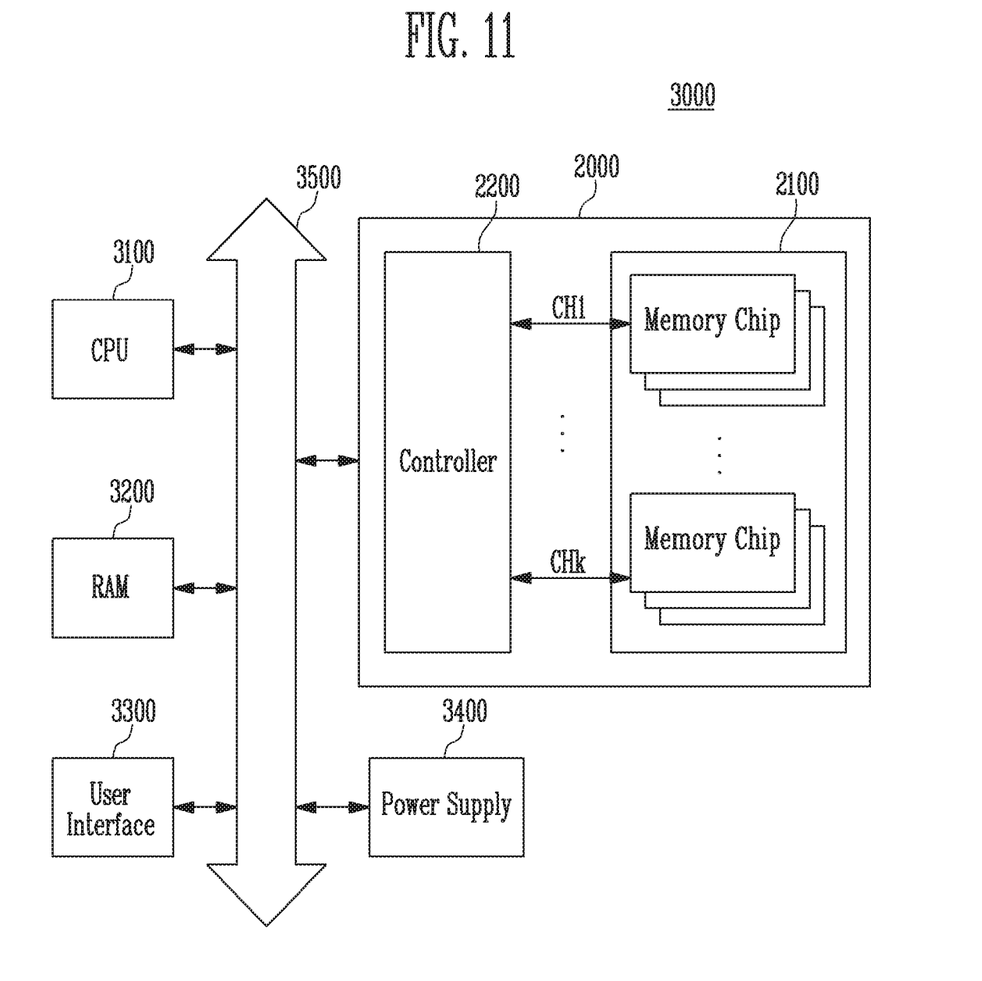
FIG. 11 is a block diagram illustrating a configuration of a computing system in accordance with an embodiment of the present invention disclosure.

FIG. 11 is a block diagram illustrating a configuration of a computing system 3000 in accordance with an embodiment of the present invention disclosure. Referring to FIG. 11, the computing system 3000 may include a central processing unit (CPU) 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

For example, the memory device 2100 may be coupled to the system bus 3500 via a controller 2200 or, alternatively, directly coupled to the system bus 3500. In the case where the memory device 2100 is directly coupled to the system bus 3500, the function of the controller 2200 may be performed by the CPU 3100 and the RAM 3200.

The computing system 3000 may include the memory system 2000 described with reference to FIG. 10, or the memory system 1000 described with reference to FIG. 9. Alternatively, the computing system 3000 may include both the memory systems 1000 and 2000 described with reference to FIGS. 9 and 10.

Various embodiments of the present invention disclosure may provide a semiconductor device having improved operating characteristics and enhanced reliability, and a method of operating the semiconductor device. More specifically, in an embodiment of the present invention, a two-operation method of programming is provided which results in distribution improvement efficiency and reduced programming time.

While the exemplary embodiments of the present invention disclosure have been disclosed for illustrative purposes, those skilled in the art will appreciate that various modifications, additions and substitutions are possible. Therefore, the scope of the present invention disclosure must be defined by the appended claims and equivalents of the claims rather than by the description preceding them.

What is claimed is:

1. A method of operating a semiconductor device, comprising:
    performing a first program operation on a selected memory cell using a first program pulse, a first bit line voltage, a first pre-verify voltage, and a first main verify voltage, with a first level difference between the first pre-verify voltage and the first main verify voltage; and
    performing a second program operation on the selected memory cell using a second program pulse, a second bit line voltage, a second pre-verify voltage, and a second main verify voltage, with a second level difference between the second pre-verify voltage and the second main verify voltage,
    wherein the second level difference is less than the first level difference, and the second bit line voltage has a level higher than a level of the first bit line voltage.

2. The method according to claim 1, wherein, during the first program operation, when a first pre-verify operation using the first pre-verify voltage passes and a first main verify operation using the first main verify voltage fails, the first bit line voltage is increased, and as the first level difference is smaller, an increment of the first bit line voltage is greater.

3. The method according to claim 1, wherein, during the second program operation, when a second pre-verify operation using the second pre-verify voltage passes and a second main verify operation using the second main verify voltage fails, the second bit line voltage is increased, and as the second level difference is smaller, an increment of the second bit line voltage is greater.

4. The method according to claim 1,
wherein, during the first program operation, when a first pre-verify operation using the first pre-verify voltage passes and a first main verify operation using the first main verify voltage fails, the first bit line voltage is increased,
wherein, during the second program operation, when a second pre-verify operation using the second pre-verify voltage passes and a second main verify operation using the second main verify voltage fails, the second bit line voltage is increased, and
wherein, when the second level difference is less than the first level difference, an increment of the second bit line voltage is greater than an increment of the first bit line voltage.

5. The method according to claim 1, wherein the performing of the first program operation comprises:
applying the first bit line voltage to a selected bit line, and applying the first program pulse to a selected word line;
applying the first pre-verify voltage to the selected word line;
applying, the first main verify voltage to the selected word line when a first pre-verify operation using the first pre-verify voltage passes;
applying an increased first bit line voltage to the selected bit line when a first main verify operation using the first main verify voltage fails; and
applying an increased first program pulse to the selected word line when the increased first bit line voltage is applied to the selected bit line, and
wherein as the first level difference is smaller, an increment of the first bit line voltage is greater.

6. The method according to claim 5, wherein, if the first main verify operation passes, the second program operation is performed.

7. The method according to claim 1, wherein the performing of the second program operation comprises:
applying the second bit line voltage to a selected bit line, and applying the second program pulse to a selected word line;
applying the second pre-verify voltage to the selected word line;
applying the second main verify voltage to the selected word line when a second pre-verify operation using the second pre-verify voltage passes;
applying an increased second bit line voltage to the selected bit line when a second main verify operation using the second main verify voltage fails; and
applying an increased second program pulse to the selected word line when the increased second bit line voltage is applied to the selected bit line, and
wherein as the second level difference is smaller, an increment of the second bit line voltage is greater.

8. The method according to claim 1, wherein the first program pulse has an increment of a first step voltage, and the second program pulse has an increment of a second step voltage less than the first step voltage.

9. The method according to claim 1, wherein, when the second program operation is performed on the selected memory cell, the first program operation is performed on an unprogrammed memory cell adjacent to the selected memory cell.

* * * * *